United States Patent
Tsoukatos et al.

(10) Patent No.: US 11,069,383 B1
(45) Date of Patent: Jul. 20, 2021

(54) THERMAL INTERFACE MATERIALS FOR IMMERSION COOLED DATA STORAGE DEVICES

(71) Applicant: Seagate Technology LLC, Cupertino, CA (US)

(72) Inventors: Antonia Tsoukatos, Maple Grove, MN (US); John W. Dykes, Eden Prairie, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/841,284

(22) Filed: Apr. 6, 2020

(51) Int. Cl.

| G11B 33/14 | (2006.01) |
|---|---|
| G11B 33/12 | (2006.01) |
| G11B 25/04 | (2006.01) |
| H05K 7/20 | (2006.01) |
| H05K 1/02 | (2006.01) |
| H01L 23/44 | (2006.01) |
| F25D 31/00 | (2006.01) |

(52) U.S. Cl.
CPC ........ G11B 33/1413 (2013.01); G11B 25/043 (2013.01); G11B 33/128 (2013.01); H01L 23/44 (2013.01); H05K 1/0203 (2013.01); H05K 7/20236 (2013.01); F25D 31/002 (2013.01); H05K 2201/064 (2013.01)

(58) Field of Classification Search
None
See application file for complete search history.

(56) References Cited

U.S. PATENT DOCUMENTS

| 4,245,668 A | 1/1981 | Lindstrom | |
|---|---|---|---|
| 4,302,793 A | 11/1981 | Rohner | |
| 5,297,621 A | 3/1994 | Taraci et al. | |
| 5,844,747 A * | 12/1998 | Wang ................. | G11B 33/1426 360/99.18 |
| 6,019,167 A | 2/2000 | Bishop et al. | |
| 7,724,517 B2 | 5/2010 | Attlesey et al. | |
| 7,764,462 B1 * | 7/2010 | Liu et al. ........... | G11B 33/1426 360/99.23 |
| 7,843,298 B2 | 11/2010 | Hosokawa et al. | |
| 7,905,106 B2 | 3/2011 | Attlesey | |
| 7,934,386 B2 | 5/2011 | Rummel et al. | |
| 8,817,465 B2 | 8/2014 | Campbell et al. | |
| 9,195,282 B2 | 11/2015 | Shelnutt et al. | |
| 9,258,926 B2 | 2/2016 | Smith | |
| 9,335,802 B2 | 5/2016 | Shelnutt et al. | |
| 9,408,332 B2 | 8/2016 | Smith | |
| 9,435,527 B1 | 9/2016 | Kluska et al. | |

(Continued)

OTHER PUBLICATIONS

Fee et al., "3D Printed Porous Media Columns with Fine Control of Column Packing Geometry," Journal of Chromatogrphy A, 1333 (Mar. 14, 2014) pp. 18-24.

(Continued)

*Primary Examiner* — Craig A. Renner
(74) *Attorney, Agent, or Firm* — Faegre Drinker Biddle & Reath LLP

(57) ABSTRACT

A data storage device includes a base deck coupled to a top cover. The data storage device includes a printed circuit board coupled to and spaced from the base deck. The data storage device also includes a thermal interface material positioned between the printed circuit board and the base deck and comprising a porous material.

19 Claims, 6 Drawing Sheets

(56) References Cited

U.S. PATENT DOCUMENTS

| | | |
|---|---|---|
| 9,504,190 B2 | 11/2016 | Best |
| 9,560,789 B2 | 1/2017 | Smith |
| 9,622,376 B2 | 4/2017 | Mathew et al. |
| 9,699,939 B2 | 7/2017 | Smith |
| 9,756,766 B2 | 9/2017 | Best |
| 9,872,415 B2 | 1/2018 | Moss et al. |
| 10,165,707 B1 | 12/2018 | Christiansen et al. |
| 10,257,963 B2 | 4/2019 | Ozyalcin et al. |
| 10,349,555 B2 | 7/2019 | Barragy et al. |
| 2002/0151799 A1 | 10/2002 | Pantages et al. |
| 2004/0050491 A1 | 3/2004 | Miya et al. |
| 2007/0213000 A1 | 9/2007 | Day |
| 2007/0227710 A1 | 10/2007 | Belady et al. |
| 2011/0132579 A1 | 6/2011 | Best et al. |
| 2013/0032217 A1 | 2/2013 | Pesek et al. |
| 2014/0109610 A1 | 4/2014 | Wulf et al. |
| 2014/0211412 A1 | 7/2014 | Best |
| 2014/0218861 A1 | 8/2014 | Shelnutt et al. |
| 2015/0013940 A1 | 1/2015 | Best et al. |
| 2015/0062806 A1 | 3/2015 | Shelnutt et al. |
| 2015/0070846 A1 | 3/2015 | Shelnutt et al. |
| 2015/0208550 A1* | 7/2015 | Rugg .......... G11B 33/1426 361/713 |
| 2015/0302897 A1 | 10/2015 | Schudel et al. |
| 2016/0234970 A1 | 8/2016 | Shelnutt et al. |
| 2016/0240226 A1 | 8/2016 | Shelnutt et al. |
| 2016/0330865 A1 | 11/2016 | Mathew et al. |
| 2019/0341080 A1* | 11/2019 | Woldemar et al. .......... G11B 33/1406 |
| 2020/0020677 A1 | 1/2020 | Chen et al. |

OTHER PUBLICATIONS

Holmes et al., "A Synergistic Approach to the Design, Fabrication and Evaluation of 3D Printed Micro and Nano Featured Scaffolds for Vascularized Bone Tissue Repair," Nanotechnology, 27 (2016) 064001.

Oevelen et al., "Optimal Channel Width Distribution of Single-Phase Microchannel Heat Sinks," Therminic, Oct. 2009 (https://www.researchgate.net/publication/224084025_Optimal_channel_width_distribution_of_single-phase_microchannel_heat_sinks).

\* cited by examiner

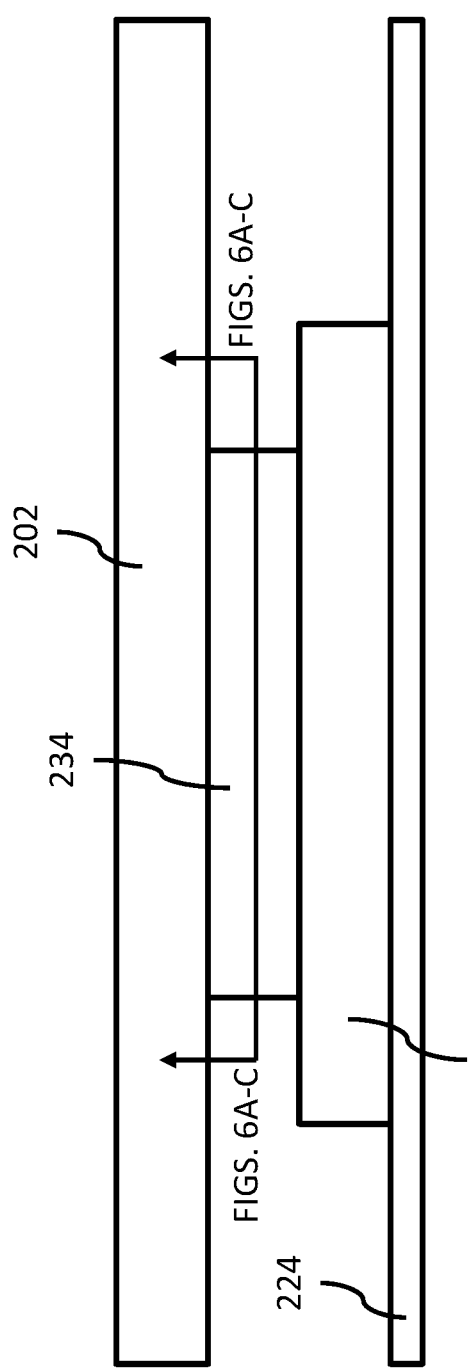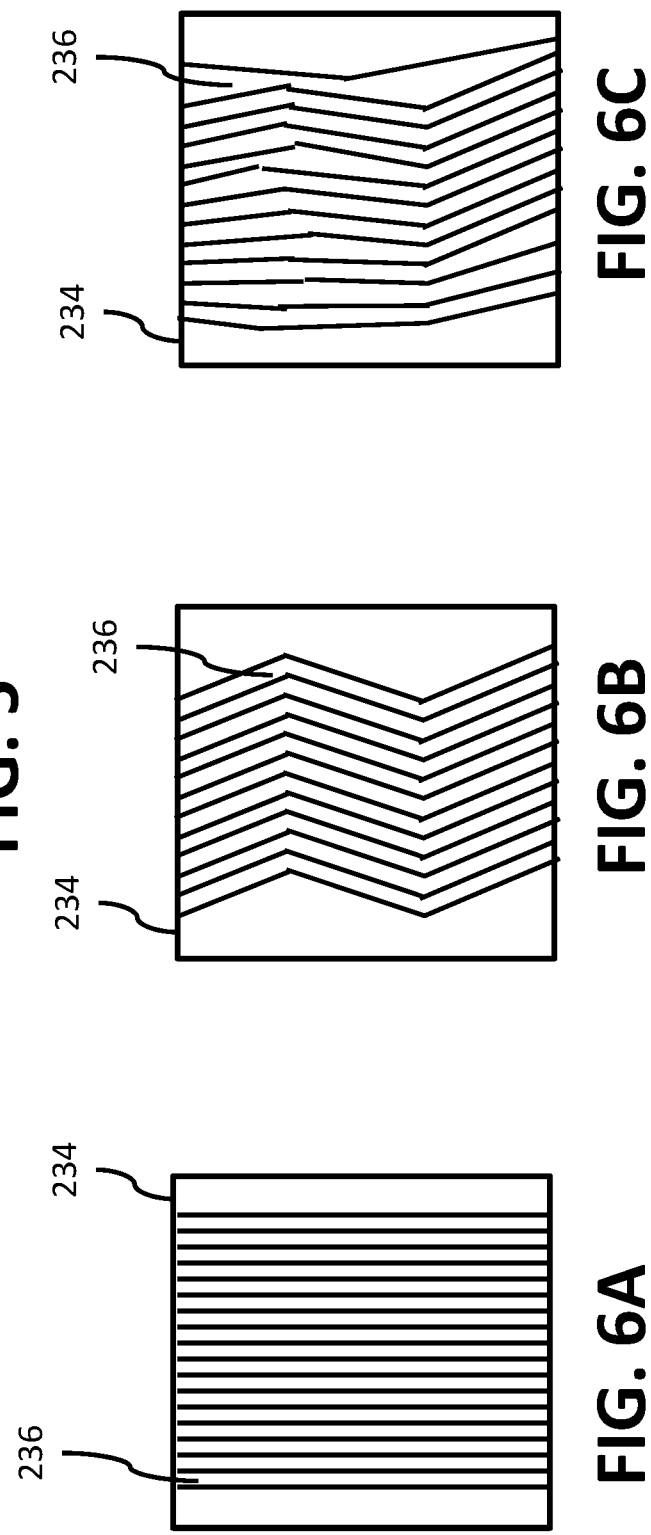

THERMAL INTERFACE MATERIALS FOR IMMERSION COOLED DATA STORAGE DEVICES

SUMMARY

In certain embodiments, a data storage device includes a base deck coupled to a top cover, a printed circuit board coupled to and spaced from the base deck, and a thermal interface material positioned between the printed circuit board and the base deck and comprising a porous material.

In certain embodiments, a system includes a data storage system with an enclosure. The system further includes data storage devices positioned within the enclosure. The data storage devices include a base deck coupled to a top cover, a printed circuit board coupled to and spaced from the base deck, and a thermal interface material positioned between the printed circuit board and the base deck and comprising a porous material.

In certain embodiments, a method for operating an immersion data storage system is disclosed. The method includes immersing a data storage device within a dielectric liquid. The data storage device includes a base deck coupled to a top cover, a printed circuit board coupled to and spaced from the base deck, and a thermal interface material positioned between the printed circuit board and the base deck and comprising channels therethrough. The method further includes operating the data storage device while immersed in the dielectric liquid and passing the dielectric liquid through the channels of the thermal interface material.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 5 shows a zoomed-in side view of the hard disk drive of FIGS. 2-4, in accordance with certain embodiments of the present disclosure.

FIGS. 6A-C show cutaway views of thermal interface materials, in accordance with certain embodiments of the present disclosure.

Figure 1:
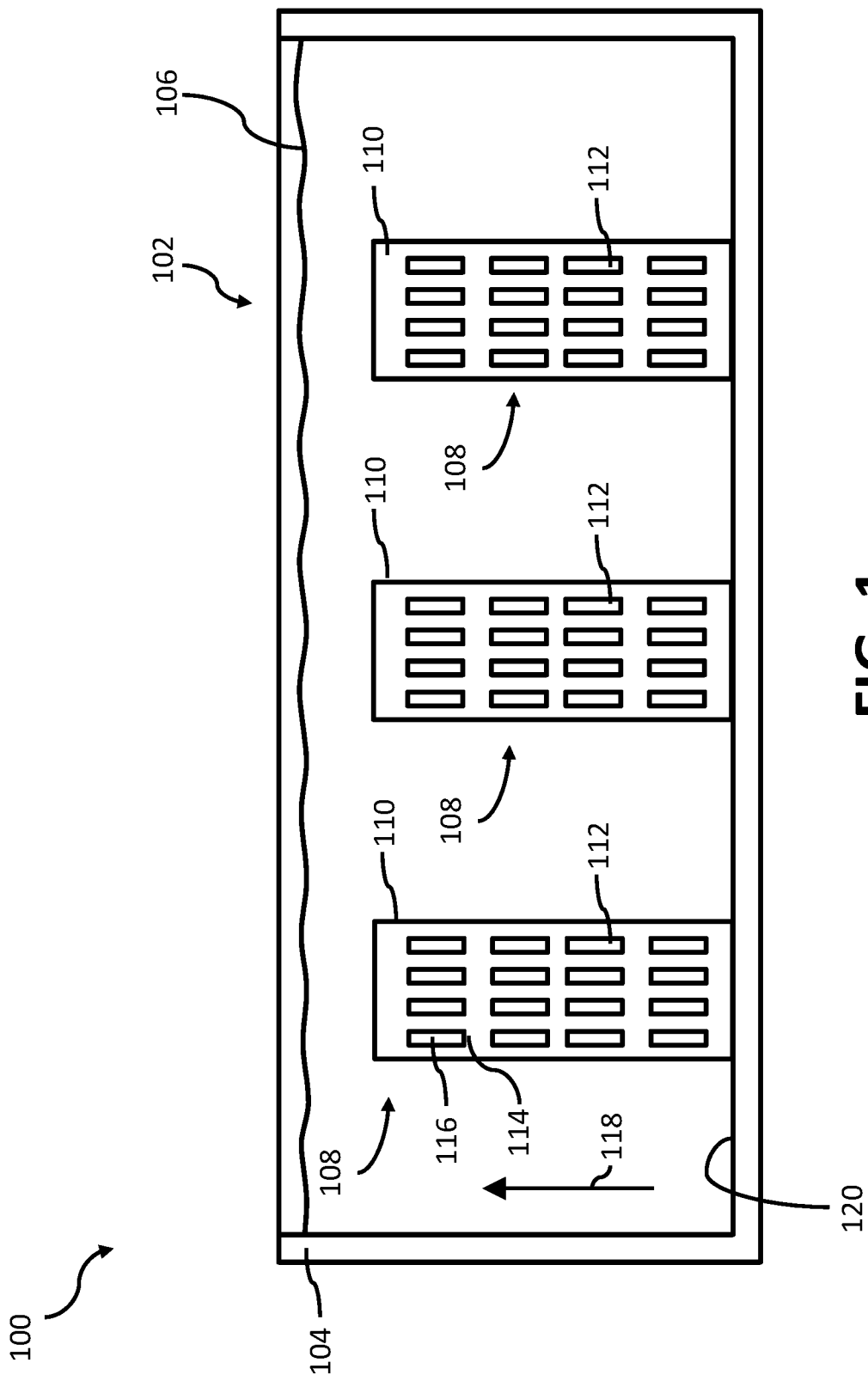
FIG. 1 shows a schematic of a cooling system and a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems are used to store and process vast amounts of data. It can be challenging to keep the systems and their components within a desired temperature range because of the amount of heat the systems typically generate during operation. For example, within data storage systems, the data storage devices themselves generate heat during operation as well as the power supply units that power the data storage devices. Data storage systems can include cooling devices such as fans that assist with keeping the systems within the desired temperature range during operation. However, fans generate acoustic energy that can induce unwanted vibration to the data storage devices. Further, fans can limit the density of data storage systems because the fans consume space that otherwise could be used for more data storage devices.

To alleviate the need for fans, data storage systems can be immersed in a dielectric liquid coolant in a tank. These liquid coolants help cool the heat-generating components (e.g., data storage devices and electrical components such as power supply units) of the data storage system without requiring fans and can reduce the amount of acoustic energy subjected to the data storage devices. However, as will be described in more detail below, certain features (e.g., thermal interface materials) used in hard disk drives can block or otherwise interfere with the ability of the liquid coolant to remove heat from or to cool heat-generating components. Certain embodiments of the present disclosure accordingly feature systems, devices, and methods for use in immersion data storage systems.

FIG. 1 shows a system 100 (e.g., an immersion data storage system) with a cooling system 102, which includes a tub or a tank 104 that is at least partially filled with a coolant 106 (e.g., a dielectric liquid coolant). Data storage systems 108 (e.g., servers) are positioned and mounted in the tank 104 and fully (or at least partially) immersed in the coolant 106. Each data storage system 108 can include a rack 110 that stores data storage devices 112 (e.g., hard disk drives, solid state drives) and electrical components (e.g., power supply units, integrated circuits).

During operation, the data storage devices 112 and electrical components are powered and generate heat. The coolant 106 is pumped through the tank 104 and is heated by the data storage devices 112 and electrical components to remove heat from the devices and components. The heated coolant 106 can be pumped through one or more pipes and heat exchangers (not shown) external to the tank 104 to be cooled and then pumped back into the tank 104. In other embodiments, one or more heat exchangers are positioned within the tank 104 and a lower-temperature liquid is pumped through the one or more heat exchangers.

The data storage devices 112 include sidewalls 114 and a bottom surface 116 and are shown in FIG. 1 as being arranged such that the data storage devices 112 rest on the sidewalls 114. This arrangement is sometimes referred to as a tombstone arrangement. Further, in this arrangement, the bottom surface 116 of the data storage devices 112 extends parallel with a direction (represented by arrow and reference number 118 in FIG. 1) that is perpendicular to a bottom floor 120 of the tank 104.

Figure 2:
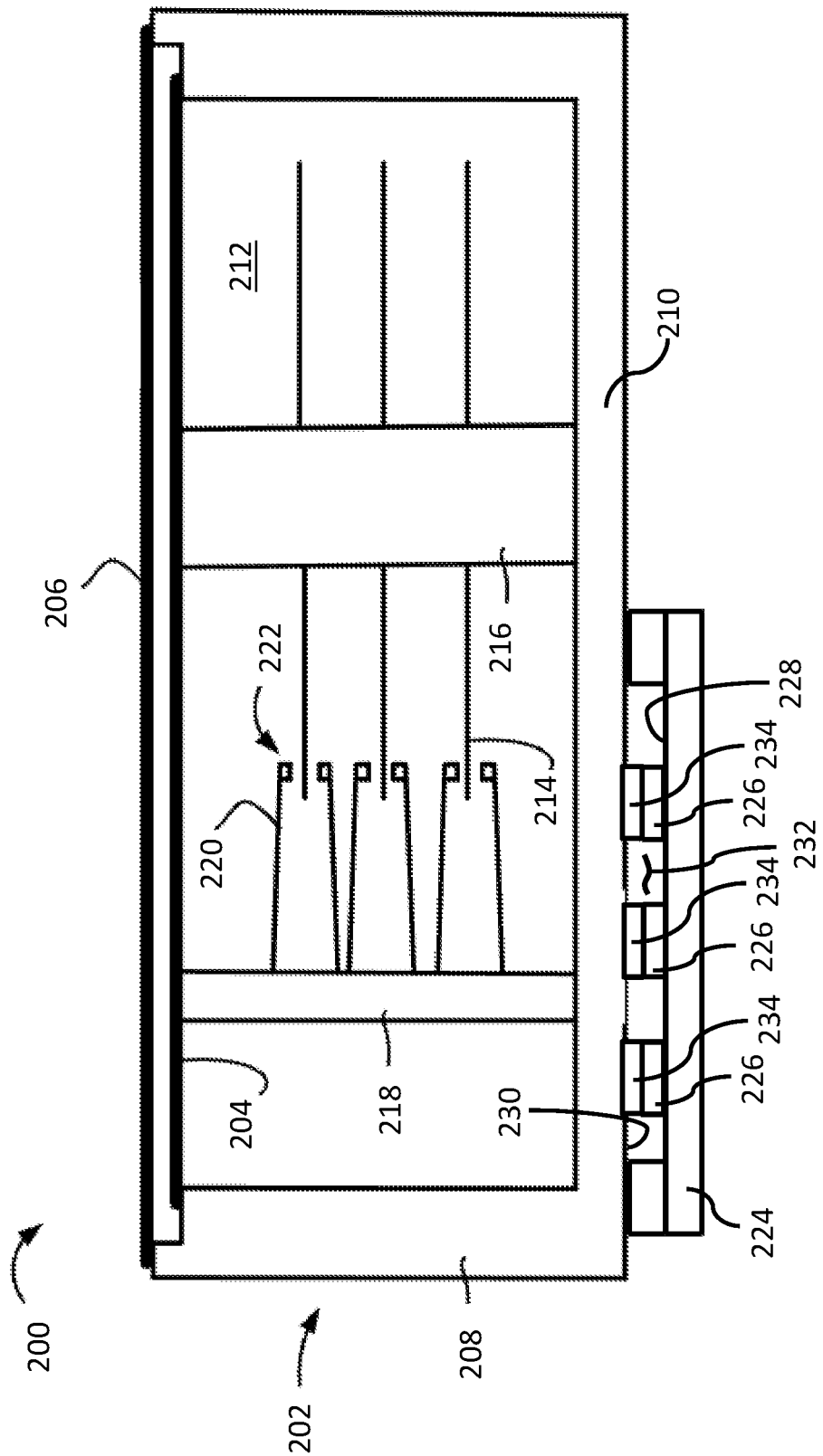
FIG. 2 shows a side, cut-away view of a hard disk drive, in accordance with certain embodiments of the present disclosure.
Figure 3:
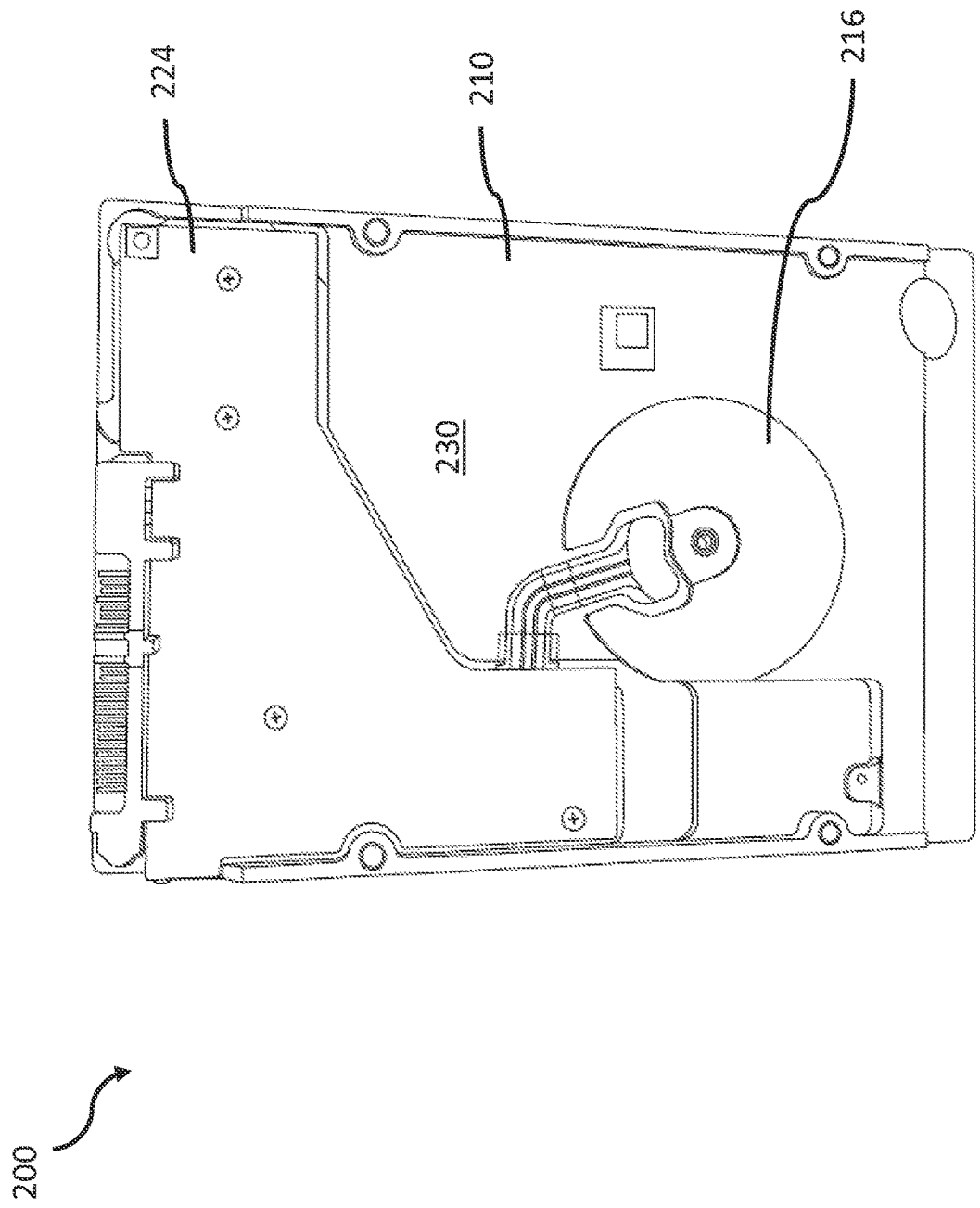
FIG. 3 shows a bottom view of the hard disk drive of FIG. 2 with a printed circuit board assembly attached, in accordance with certain embodiments of the present disclosure.
Figure 4:
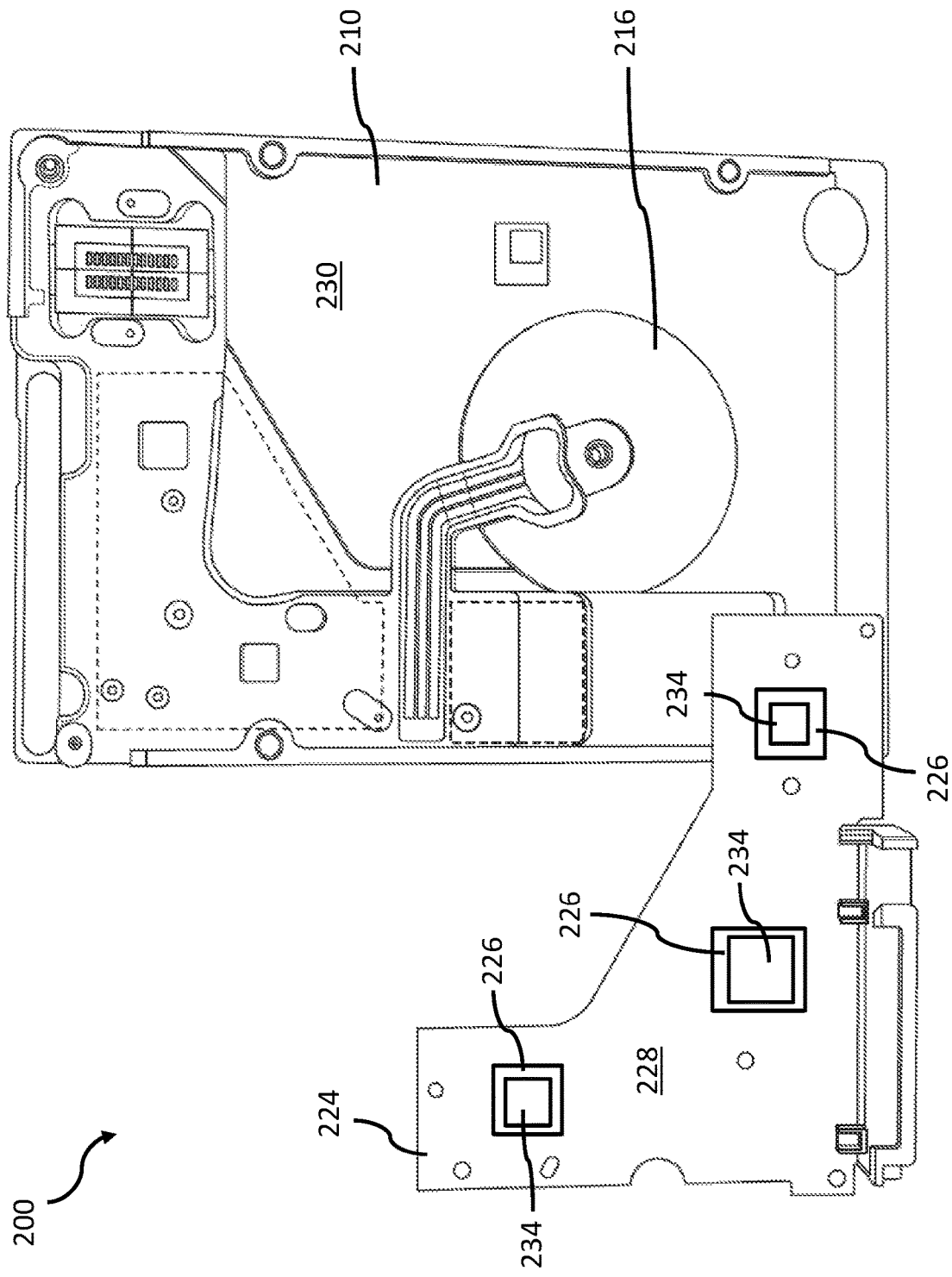
FIG. 4 shows a bottom view of the hard disk drive of FIGS. 2 and 3 with a printed circuit board assembly of FIG. 3 detached, in accordance with certain embodiments of the present disclosure.

As mentioned above, the immersion data storage systems 100 can include data storage devices 112 such as hard disk drives. FIG. 2 shows a cut away schematic of a hard disk drive 200, FIG. 3 shows a bottom view of the hard disk drive 200, and FIG. 4 shows a bottom view of the hard disk drive 200 partially unassembled.

The hard disk drive 200 includes a base deck 202, a process cover 204, and a final cover 206. The base deck 202 includes side walls (e.g., side wall 208) that, together with a bottom portion 210 of the base deck 202 and the process cover 204, creates an internal cavity 212 that may house data storage components like magnetic recording media 214, a spindle motor 216, an actuator pivot 218, suspensions 220, and read/write heads 222. In certain embodiments, the base deck 202 comprises an aluminum alloy. The spindle motor 216 and the actuator pivot 218 are shown in FIG. 2 as being coupled between the process cover 204 and the bottom portion 210 of the base deck 202.

During assembly, the process cover 204 can be coupled to the base deck 202 by removable fasteners (not shown) and a gasket (not shown) to seal a target gas (e.g., air with nitrogen and oxygen and/or a lower-density gas like helium) within the internal cavity 212. Once the process cover 204 is coupled to the base deck 202, a target gas may be injected into the internal cavity 212 through an aperture in the process cover 204, which is subsequently sealed. Injecting the target gas, such as a combination of air and a low-density gas like helium (e.g., 90 percent or greater helium), may involve first evacuating existing gas from the internal cavity 212 using a vacuum and then injecting the target gas from a low-density gas supply reservoir into the internal cavity 212. The aperture can be sealed (by applying a seal, welding, or the like) to keep the target gas within the hard disk drive 200 and, in particular, the internal cavity 212.

Once the process cover 204 is sealed, the hard disk drive 200 can be subjected to a variety of processes and tests. Example processes and tests include those that establish performance parameters of the hard disk drive 200 (e.g., fly-height parameters), that identify and map flaws on the magnetic recording media 214, that write servo and data patterns on the magnetic recording media 214, and that determine whether the hard disk drive 200 is suitable for commercial sale. After the hard disk drive 200 is processed and passes certain tests, the internal cavity 212 may be refilled with the target gas and then resealed.

FIGS. 2-4 show the hard disk drive 200 with the base deck 202 being coupled to and spaced from a printed circuit board 224. The printed circuit board 224 includes one or more integrated circuits (hereinafter referred to as the "chips 226" and shown in FIGS. 2 and 4). As shown in FIG. 2, the chips 226 are positioned on a surface 228 of the printed circuit board 224 that faces a bottom surface 230 of the base deck 202. During factory testing and in-the-field operation of the hard disk drive 200, the chips 226 are powered on to carry out various operations of the hard disk drive 200. For example, the chips 226 can include a system-on-a-chip (SOC) that includes firmware and various microprocessors that manage operations of the hard disk drive 200. These chips 226 generate heat in a concentrated space 232 (shown in FIG. 2) between the printed circuit board 224 and the base deck 202.

Positioned between the base deck 202 and at least one of the chips 226 are one or more individual inserts of thermal interface material 234 (hereinafter referred to as the "TIM 234"). During factory testing of the hard disk drive 200 (which is performed in air rather than liquid immersion and which can take weeks), the TIM 234 helps maintain the chips 226 within their desired operating temperature range by transmitting heat generated by the chips 226 through the TIM 234 and to the base deck 202. When the hard disk drive 200 is in the air environment of the factory test systems, the TIM 234 more easily and/or more efficiently pulls heat away from the chips 226 than air cooling. If the chips 226 overheat, the performance of the chips 226 is negatively affected. When the hard disk drive 200 is positioned in an immersion data storage system, coolant of the immersion data storage system may be a more efficient and preferred approach for pulling heat from the chips 226. This is because, in part, using the TIM 234 to transfer heat to the base deck 202 can create hot spots within the hard disk drive 200 and negatively affect performance of certain components of the hard disk drive 200. Further, the TIM 234 may interfere with or otherwise block the coolant from flowing through the space between the chips 226 and the base deck 202. Certain embodiments described below feature one or more TIMs 234 that are porous such that liquids (e.g., coolants) can flow between the chips 226 and the base deck 202.

FIG. 3 shows the hard disk drive 200 with the printed circuit board 224 assembled to the base deck 202, and FIG. 4 shows the hard disk drive 200 with the printed circuit board 224 unassembled to show example positions of the chips 226 coupled to the printed circuit board 224. Although the TIMs 234 are shown in FIG. 4 as covering only a portion of the chips 226, the TIMs 234 can cover an entire surface of the chips 226. The TIMs 234 can be attached (e.g., adhered) to the chips 226. Additionally or alternatively, the TIMs 234 can be compressed between the chips 226 and the base deck 202. In certain embodiments, the space between the chips 226 and the base deck 202 is 1 mm or less. As such, the TIMs 234 can have a thickness that is 1 mm or less or that is otherwise slightly greater than the distance between the chips 226 and the base deck 202.

As alluded to above, the TIMs 234 can be porous and can have a porosity that allows liquids to flow through the TIMs 234. In certain embodiments, coolants used in immersion data storage systems have a density that is close to the density of water (e.g., 1000 kg/m$^3$). As such, the TIMs 234 can have a porosity that allows a liquid with a density of 2000 kg/m$^3$ or less to pass through the TIMs 234. In certain embodiments, as will be described in more detail below, the porosity of the TIMs 234 is at least partially formed by channels (e.g., microchannels) through the TIMs 234.

The TIMs 234 can comprise a polymer and a heat-conductive material (e.g., a metal). For example, the TIMs 234 can comprise a polymer that is impregnated with a metal (e.g., an oxidized metal) comprising silver, copper, gold, aluminum, zinc, and/or tungsten. This combination of a polymer and metallic material allows the TIMs 234 to effectively draw heat from the chips 226 to the base deck 202 when the hard disk drive 200 is being factory tested while also allowing coolant to draw heat away from the chips 226 when the hard disk drive 200 is immersed in the coolant. In embodiments, the particular materials to be used for the TIMs 234 can be chosen such that the materials do not chemically react with the coolant. Depending on the particular composition of the coolant, traditional TIM materials can degrade when immersed in the coolant. As such, the composition of the TIMs 234 can be chosen to chemically degrade less quickly than other compositions.

When immersed, the heat generated by the chips 226 can be drawn away from the chips 226 both by the coolant and—to a lesser extent—by the TIMs 234 to the base deck 202. For example, as heat passes from the chips 226 to the TIMs 234, some heat can then be passed to the coolant flowing through the porous TIMs 234 while other heat continues to pass through the TIMs 234 into the base deck 202.

The TIMs 234 can be created by three-dimensional (3D) printing (e.g., additive manufacturing) techniques. Using 3D printing, the overall shape of the TIMs 234 can be customized. For example, as shown in FIG. 4, the bottom surface 230 of the base deck 202 may not be flat, so the surface of the TIMs 234 contacting the bottom surface 230 can be made to substantially conform to the profile of the bottom surface 230 and features of the base deck 202 such that there are few gaps between the surface of the TIMs 234 and the bottom surface 230 of the base deck 202.

As will be shown in FIGS. 5 and 6A-C, the particular shape, size, and position of the pores of the TIMs 234 may be controlled (e.g., via 3D printing techniques). FIG. 5 shows a side view of portions of the base deck 202, the printed circuit board 224, one of the chips 226, and one of the TIMs 234, and FIGS. 6A-C show cross-sections of the TIM 234 with different examples of channels 236 that can extend through the TIMs 234.

FIG. 6A shows the channels 236 as being relatively straight and uniform paths through which coolant can flow through the TIMs 234 to draw heat away from the chips 226. FIG. 6B shows the channels 236 as extending in a herringbone-like design with uniform paths through which coolant can flow through the TIMs 234. FIG. 6C shows the channels 236 as being irregular paths through which coolant can flow through the TIMs 234.

In certain embodiments, the channels 236 have a cross section that is circular-shaped and/or that is sized to allow for the coolant to flow through the channels 236 (and therefore the TIMs 234). In certain embodiments, the TIMs 234 are positioned and oriented such that the channels 236 extend along the direction 118 (shown in FIG. 1) that is perpendicular to the surface of the bottom floor 120 of the tank 104 of the immersion data storage system 100. As such, to the extent the heat generated by the chips 226 creates bubbles (e.g., by heating the coolant above its boiling temperature), the bubbles can flow to the top of the tank 104.

Figure 7:
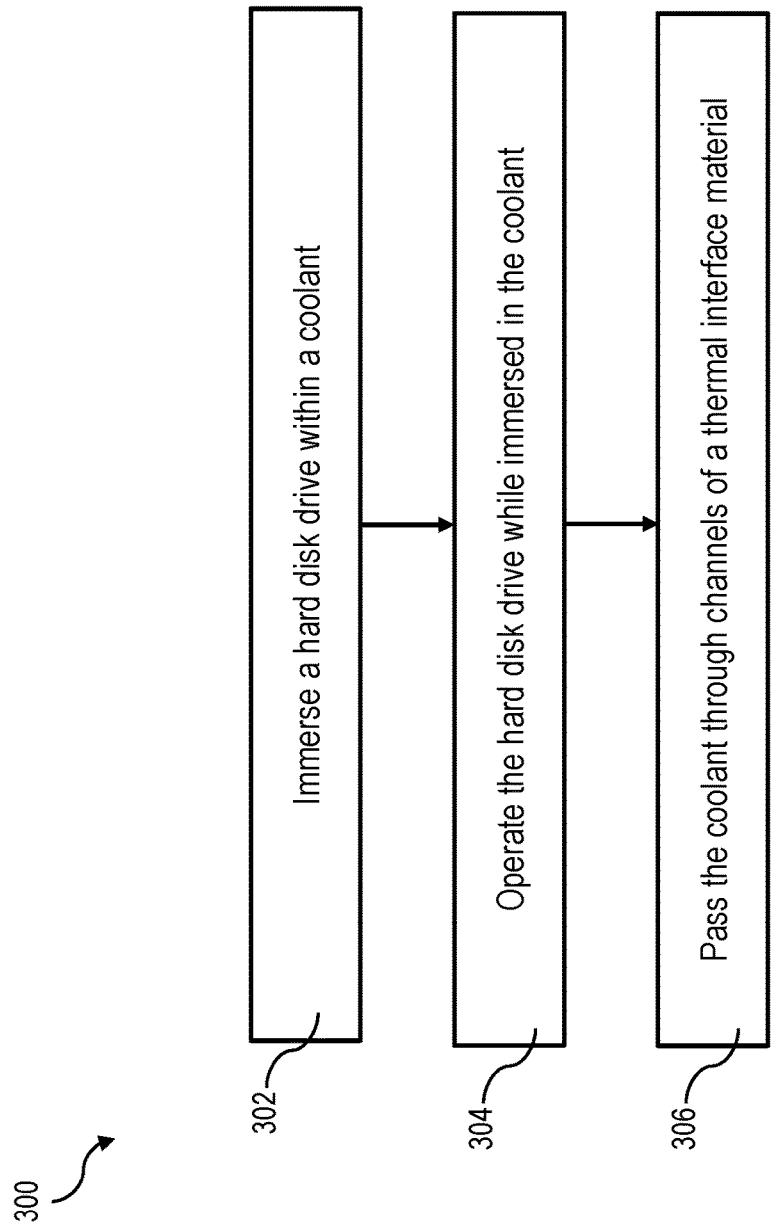
FIG. 7 shows a block diagram of steps of a method, in accordance with certain embodiments of the present disclosure.

FIG. 7 outlines a method 300 for operating the immersion data storage system 100. The method 300 includes immersing the hard disk drive 200 within the coolant 106 (block 302 in FIG. 7). The method 300 further includes operating the hard disk drive 200 while immersed in the coolant 106 (block 304 in FIG. 7). The method further includes passing the coolant 106 through the channels 236 of the TIM 234 (block 306 in FIG. 7).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
a data storage device including:
a base deck coupled to a top cover, a printed circuit board coupled to and spaced from the base deck, and a thermal interface material (TIM) positioned between the printed circuit board and the base deck and comprising a porous material.

2. The system of claim 1, wherein the TIM has a porosity that allows a liquid to flow through the TIM.

3. The system of claim 1, wherein the TIM has a porosity that allows a liquid, having a density of 2000 kg/m³ or less, to flow through the TIM.

4. The system of claim 1, wherein the TIM comprises a polymer.

5. The system of claim 4, wherein the polymer is impregnated with a metal.

6. The system of claim 5, wherein the metal comprises silver, copper, gold, aluminum, zinc, and/or tungsten.

7. The system of claim 1, wherein an integrated circuit is coupled to the printed circuit board, wherein the TIM is positioned between the integrated circuit and the base deck.

8. The system of claim 7, wherein the TIM is attached to the integrated circuit.

9. The system of claim 8, wherein the TIM is adhered to the integrated circuit.

10. The system of claim 7, wherein the TIM is compressed between the integrated circuit and the base deck.

11. The system of claim 7, wherein the TIM is positioned such that heat generated from the integrated circuit passes to the TIM and then to either the base deck or a liquid passing through the TIM.

12. The system of claim 1, wherein the data storage device is hermetically sealed.

13. The system of claim 1, wherein pores of the TIM include channels extending therethrough.

14. The system of claim 1, further comprising:
a data storage system including an enclosure, wherein the data storage device is positioned within the enclosure; and
a cooling system including a tank, wherein the data storage system is positioned within the tank.

15. The system of claim 14, further comprising multiple additional data storage devices positioned within the enclosure.

16. The system of claim 14, wherein the tank is at least partially filled with a coolant.

17. The system of claim 16, wherein the data storage system is at least partially immersed in the coolant.

18. The system of claim 16, wherein the TIM has a porosity that allows the coolant to flow through the TIM.

19. The system of claim 18, wherein the density of the coolant is 2000 kg/m³ or less.

* * * * *